United States Patent
Hung et al.

(10) Patent No.: US 8,527,839 B2
(45) Date of Patent: Sep. 3, 2013

(54) ON-THE-FLY REPAIR METHOD FOR MEMORY

(75) Inventors: Chun-Hsiung Hung, Hsinchu (TW);
Shuo-Nan Hung, Hsinchu (TW);
Tseng-Yi Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 419 days.

(21) Appl. No.: 13/017,372

(22) Filed: Jan. 31, 2011

(65) Prior Publication Data
US 2012/0198298 A1    Aug. 2, 2012

(51) Int. Cl.
*G11C 29/00*  (2006.01)
(52) U.S. Cl.
USPC .......................................... 714/764
(58) Field of Classification Search
USPC ............... 714/746, 763–764, 768–769
See application file for complete search history.

(56) References Cited

U.S. PATENT DOCUMENTS

| | | | | |
|---|---|---|---|---|
| 6,038,175 A * | 3/2000 | Ra | ............................ | 365/185.29 |
| 7,079,430 B2 * | 7/2006 | Yen et al. | ...................... | 365/200 |
| 7,290,197 B2 * | 10/2007 | Ball | .............................. | 714/763 |
| 7,430,693 B2 * | 9/2008 | Noguchi et al. | ............. | 714/710 |
| 8,381,075 B2 * | 2/2013 | Toops et al. | .................... | 714/768 |

\* cited by examiner

*Primary Examiner* — Shelly A Chase
(74) *Attorney, Agent, or Firm* — McClure, Qualey & Rodack, LLP

(57) ABSTRACT

An on-the-fly repair method for a memory includes: performing a block erase operation on the memory; checking whether the block erase operation is passed or not; finding whether there is any available and healthy redundancy block in the memory if the block erase operation is not passed; programming an address of a failed block to be repaired, an enable bit and at least one error correction bit into both first and second redundancy information regions in a redundancy information set of the memory; checking whether error in the first and the second redundancy information regions is recoverable based on the error correction bit; and if the error is recoverable, then programming the redundancy information set as effective to replace the failed block by the redundancy block related to the effective redundancy information set.

15 Claims, 3 Drawing Sheets

ON-THE-FLY REPAIR METHOD FOR MEMORY

TECHNICAL FIELD

The invention relates in general to a repair method for a memory and more particularly to an on-the-fly repair method for a memory after the memory is shipped to the customer.

BACKGROUND

In recent years, non-volatile memories that are data-rewritable semiconductor devices are widely used. Before the memories are shipped to the customer, the memories are tested or screened. If bad blocks are found in the memory during test, the bad blocks are repaired by for example laser repair. After repair, the passed memory is shipped to the customer.

In the following, discussed are two situations, a system having a memory controller and a system without a memory controller.

Normally, a system has a memory controller to serve the flash memory. The block would be marked as a bad block by the controller if the flash memory in the system happened to be failed during block erase, so the number of bad blocks would get bigger when the operation time goes by (i.e. after multiple usage of the memory).

Also, consider a case that there is no controller in a system to serve flash memory. The flash memory could be probably accessed by other device (for example a CPU) directly without a controller acted as an interface. If other device would access some content in some specific physical address of the flash memory, the system would go wrong when anyone block in those specific physical address faces erase failure problem.

However, after the memory is shipped to the customer, after use, a normal block or normal blocks of the memory may become bad block(s). Because usually the user does not have a suitable machine to repair the newly-found bad block(s), the newly-found bad block(s) is/are not repaired. If the newly-found bad block(s) is/are very important, the memory would not work normally. Therefore, it needs an on-the-fly repair method for memory even after the memory is shipped. In the following, the term "on-the-fly" has the same or similar meaning with directly or immediately.

BRIEF SUMMARY

Embodiment of an on-the-fly repair method for a memory is disclosed. By the disclosed method, in the situation that a system having a controller accompanied with a memory, redundancy blocks could be used more efficiently. In more details, they not only repair bad blocks which are screened before shipping but also repair erase failed blocks on-the-fly while the memory is operating in a system after shipping.

Embodiment of an on-the-fly repair method for a memory is disclosed. By the disclosed method, in the situation that a system not having a controller for a memory, the memory itself would automatically find a redundancy block to repair a region of specific physical address.

An exemplary embodiment of an on-the-fly repair method for a memory is provided. The on-the-fly repair method includes: performing a block erase operation on the memory; checking whether the block erase operation is passed or not; finding whether there is any available and healthy redundancy block in the memory if the block erase operation is not passed; programming an address of a failed block to be repaired, an enable bit and at least one error correction bit into both first and second redundancy information regions in a redundancy information set of the memory; checking whether error in the first and the second redundancy information regions is recoverable based on the error correction bit; and if the error is recoverable, then programming the redundancy information set as effective to replace the failed block by the redundancy block related to the effective redundancy information set.

Another exemplary embodiment of an on-the-fly repair method for a memory is provided. The on-the-fly repair method includes: reading a redundancy information set of the memory and checking whether the redundancy information set is effective based on the redundancy information set; if the redundancy information set is effective, reading the redundancy information set and repairing a failed block of the memory by a redundancy block related to the effective redundancy information set; if the redundancy information set is not effective, reading the redundancy information set and checking whether the redundancy information set is problematic based on the redundancy information set; and if the redundancy information set is neither effective nor problematic, reading the redundancy information set to determine to program the redundancy information set as effective or problematic based on the redundancy information set.

It is to be understood that both the foregoing general description and the following detailed description are exemplary and explanatory only and are not restrictive of the disclosed embodiments, as claimed.

DETAILED DESCRIPTION OF EMBODIMENTS OF THE INVENTION

In an exemplary embodiment of the invention, a flash memory could do on-the-fly repair automatically while facing erase failure so that redundancy blocks are used in the most efficient degree. It means that whenever erase failure happened (even after the memory is shipped out), the flash memory would try to find a healthy and unused redundancy block to replace the erase-failed block.

For the system with a memory controller, if at least one healthy and unused redundancy block is available, the controller will not mark that erase-failed block as a bad one and instead, the erase-failed block is replaced with the healthy and unused redundancy block. In that case, it won't lead to decreasing of number of total good block of the memory chip.

For the system without a memory controller, other device might try to access the content in some specific blocks in some specific physical address. If a specific block is facing erase failure, then on-the-fly repair method will make the erase-failed specific block still valid after the erase-failed block is replaced with healthy and unused redundancy block.

Figure 1:
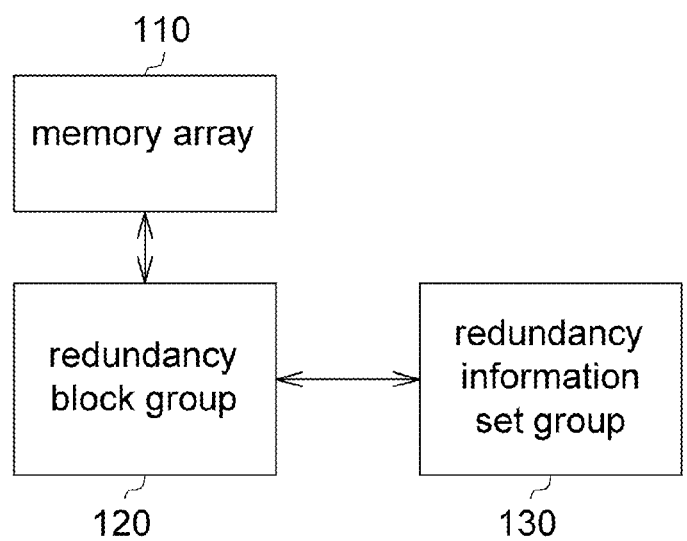
FIG. 1 shows a diagram for a memory according to an embodiment of the invention.

FIG. 1 shows a diagram for a memory according to an embodiment of the invention. As shown in FIG. 1, the memory 100 at least includes a memory array 110 having a plurality of blocks, a redundancy block group 120 having several redundancy blocks and a redundancy information set group 130 having several redundancy information sets. Structure and operation of the memory array 110 are not discussed and specified here.

When the memory 100 faces erase failure during erase operation in a system (no matter the system is with or without a memory controller), the memory 100 itself does on-the-fly repair if there still is at least one available healthy redundancy block.

Figure 2:
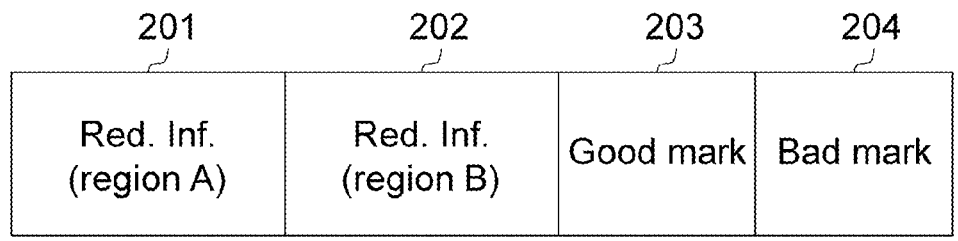
FIG. 2 shows the redundancy information set 200 according to the embodiment of the invention.

FIG. 2 shows the redundancy information set 200 according to the embodiment of the invention. The memory 100 would replace a failed block relying on this redundancy information set 200 even after the memory 100 is shipped. The redundancy information set 200 includes redundancy information region A 201, redundancy information region B 202, a good mark region 203 and a bad mark region 204.

Redundancy information regions 201 and 202 store exactly the same data in ideal (i.e. no charge loss). Redundancy information regions 201 and 202 store the address of the associated failed block to be on-the-fly repair, an enable bit and ECC bit(s). The ECC bit(s) are obtained by performing ECC coding on the address of the associated failed block and the enable bit. Regarding ECC, a capable enough ECC is used to recovery this important information if the address of the associated failed block or/and the enable bit stored in the regions 201 and/or 202 is in error. However, if the total error bits in the associated failed block and the enable bit exceed the recovery threshold of the ECC algorithm, then the redundancy information regions 201 and 202 are not be recovered.

The good mark region 203 stores a good mark to represent whether this redundancy information set 200 is an effective one. For example, the good mark region 203 is an 8-bit region whose initial value is for example but not limited to "1". After it is checked that the redundancy information set 200 is good, that all bits of the good mark region 203 is programmed for example but not limited to "0". However, because the memory 100 may suffer from charge loss, the programmed "0" bit(s) in the good mark region 203 may be accidently changed from "0" to "1". So in the embodiment, if the number of the programmed bits in the good mark region 203 is larger or equal to a criteria M1 (for example but not limited M1=6 in a 8-bit good mark region), then the redundancy information set 200 is still regarded as good by checking the good mark region 203.

On the contrary, the bad mark region 204 stores a bad mark to represent whether this redundancy information set 200 is a bad one. For example, the bad mark region 204 is an 8-bit region whose initial value is for example but not limited to "1". After it is checked that the redundancy information set 200 is bad or problematic, that all bits of the bad mark region 204 is programmed for example but not limited to "0". However, because the memory 100 may suffer from charge loss, the programmed "0" bit(s) in the bad mark region 204 may be accidently changed from "0" to "1". So in the embodiment, if the number of the programmed bits in the bad mark region 204 is larger or equal to another criteria M2 (for example but not limited M2=6 in a 8-bit bad mark region), then the redundancy information set 200 is still regarded as bad by checking the bad mark region 204.

Figure 3:
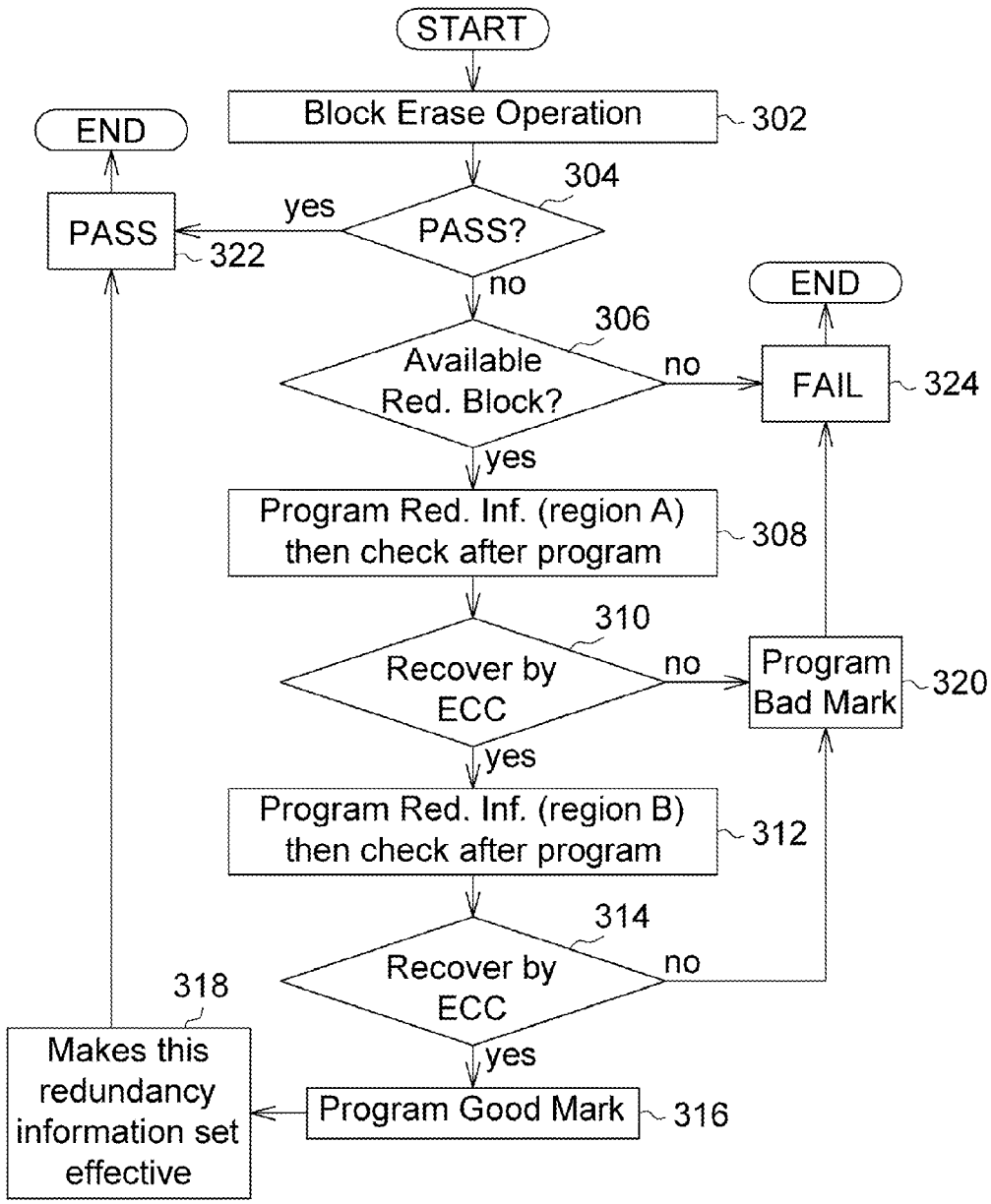
FIG. 3 shows a detail flow chart of the on-the-fly repair for the memory according to the embodiment of the invention.

Now describe how to perform the on-the-fly repair on the memory according to the embodiment of the invention. FIG. 3 shows a detail flow chart of the on-the-fly repair for the memory according to the embodiment of the invention. As shown in FIG. 3, in step 302, a block erase operation is performed. In step 304, it is checked that whether the block erase operation is passed or not. If pass, then the flow goes to step 322, indicating that the block erase operation is passed. In not passed, then the flow continues to try to repair the failed block.

In step 306, it is checked that whether there is still any available and healthy redundancy block. If yes, then the flow goes to step 308; and if no, then the flow goes to step 324, indicating that the block erase operation is failed.

In step 308, the redundancy information region A 201 is programmed. As discussed above, the address of the failed block, the enable bit and the ECC bit(s) are programmed into the redundancy information region A 201. After program, the address of the failed block and the enable bit in the redundancy information region A 201 is checked. Of course, after program, the redundancy information region A 201 is verified.

In step 310, if there is error in the address of the failed block and the enable bit, it is checked that whether the error is recovered by ECC algorithm. In detail, assume the ECC algorithm can recover N bit(s) at most. If the error bit(s) is/are not larger than N bit(s), then the error can be recovered by ECC algorithm; and vice versa. In step 310, if the error can be recovered, then the flow goes to step 312; and if the error is not recovered, then the flow goes to step 320 to program bad mark in the bad mark region 204 of the redundancy information set 200.

Steps 312 and 314 are the same or similar to that of steps 308 and 310, so the details thereof are not described here. Similarly, in step 314, if the error can be recovered, then the flow goes to step 316; and if the error is not recovered, then the flow goes to step 320 to program bad mark in the bad mark region 204 of the redundancy information set 200.

In step 316, because the redundancy information regions 201 and 202 are both successfully programmed, the good mark region 203 in the redundancy information set 200 is programmed.

In step 318, the flow makes the redundancy information set as an effective one and then the flow goes to step 322. As long as the redundancy information set is programmed as effective, the failed block is successfully on-the-fly repaired by the redundancy block. So, in trying to read the failed block, because the failed block is successfully on-the-fly repaired by the redundancy block, the redundancy block is read based on the effective redundancy information set.

Figure 4:
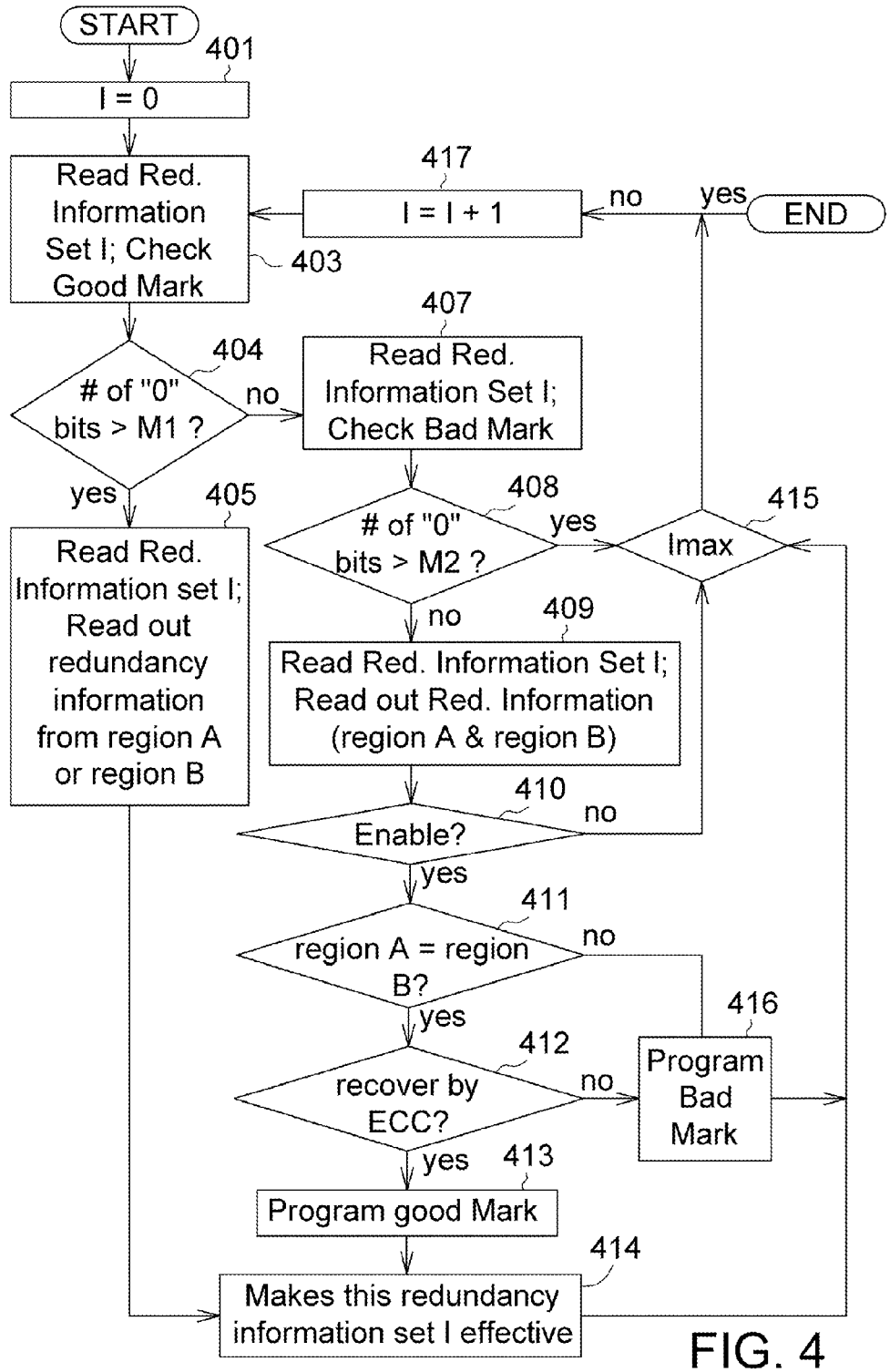
FIG. 4 is a check flowchart according to the embodiment of the invention to check the redundancy information set is effective or not.

Further, in the embodiment of the invention, to make sure the integrity of the redundancy information sets, it is suggested to do a CHECK command after ABORT or RESET command is issued from for example but not limited by user while an erase operation is still running or after accidentally power off. It is also suggested to do the CHECK command after powering on. FIG. 4 is a check flowchart according to the embodiment of the invention to check the redundancy information set is effective or not so as to on-the-fly repair the failed block.

In the embodiment, two criterions M1 and M2 are set to indicate whether the good mark or the bad mark are reliable or not. Both M1 and M2 may be set as for example but not limited to 6.

In step 401, a parameter I is set. The parameter I is used to indicate which redundancy information set I is under the CHECK command. If there are 10 redundancy information sets 200 in the redundancy information set group 130, then I may be for example but not limited to 0~9.

In step 403, the redundancy information set I is read and the good mark pattern in the good mark region 203 is checked.

In step 404, it is checked whether the number of "0" bits in the good mark region 230 larger than M1. If yes, it represents this redundancy information set I is effective and reliable; and the redundancy information in the redundancy information region A or region B in the redundancy information set I is read at step 405 and the replacement of the failed block by the redundancy block related to the effective redundancy information set I is effective (i.e. the redundancy information set I is made as effective) at the step 414. If not, there are several possibilities which are discussed below.

In step 407, the redundancy information set I is read and the bad mark pattern in the bad mark region 204 is checked. In step 408, it is checked whether the number of "0" bits in the bad mark region 204 is larger than M2. If yes, it represents this redundancy information set I is bad or problematic and the flow goes to step 415; and if no, then the flow goes to step 409.

In step 409, the redundancy information set I is read; and further the redundancy information region A 201 and region B 202 is read. In step 410, the respective enable bit in the redundancy information region A 201 and region B 202 are checked. If the enable bit is set, then the flow goes to step 411; and if not, then the flow goes to step 415.

In step 411, it is checked whether the redundancy information region A 201 and region B 202 are the same or not. In ideal, the redundancy information region A 201 and region B 202 should be the same. However, in some situations discussed below, the redundancy information region A 201 and region B 202 may be not the same. If yes in step 411, then the flow goes to step 412; and if no in step 411, then the flow goes to step 416.

In step 412, it is checked that whether the error bits in the redundancy information region A 201 and region B 202 is recovered by the ECC algorithm or not. If yes in step 412, then the flow goes to step 413; and if no in step 412, then the flow goes to step 416.

In step 413, the good mark in the good mark region 203 in the redundancy information set I is programmed because the redundancy information set I is enabled (in step 410), the region A and region B are the same (in step 411) and error bits in the region A and region B can be recovered.

In step 414, after the good mark in the good mark region 203 in the redundancy information set I is programmed, the redundancy information set I is made as effective. In other words, the failed block is replaced by the redundancy block related to the redundancy information set I.

In step 415, it is checked that I reaches the upper limit Imax or not. If yes, then all redundancy information sets 200 in the redundancy information set group 130 are checked; and the flow goes to end. If no, then the flow goes to step 417 for I=I+1 to check the next redundancy information set.

In step 416, the bad mark in the bad mark region 204 in the redundancy information set I is programmed because the region A and region B are different same (no in step 411) or error bits in the region A and region B is not recovered. If the bad mark in the bad mark region 204 in the redundancy information set I is programmed, it means that the redundancy information set I is made as an invalid one. In other words, the failed block can not be replaced by the redundancy block related to the redundancy information set I.

As discussed above, even if the number of "0" bits in the good mark is not larger than M1 in step 404, there would be several possibilities in the embodiment.

Possibility one: This redundancy information set I has never been used before. If so, then the number of "0" bits in the good mark is not larger than M1; the number of "0" bits in the bad mark is not larger than M2; and the enable bit in the region A and region B is not set (i.e. the redundancy information set I not enabled). If this case, the flow would be: 404->407->408->409->410->415. There would be an enable bit in region A (201) and region B (202) to indicate whether this redundancy information set I is enabled or not. Step 410 is to check this enable bit.

Possibility two: This redundancy information set I has a bad mark. If so, then the number of "0" bits in the good mark is not larger than M1; and the number of "0" bits in the bad mark is larger than M2. So the flow would be: 404->407->408->415.

Possibility three: the redundancy information set I was not completely finished programming while doing on-the-fly repair during the last time erase operation. This could be caused by a RESET or ABORT command issued by user or an accidental powering off before the on-the-fly repair operation is done. The redundancy information regions 201 and 202 were programmed to the expected pattern but the good mark region 203 was failed to be programmed. If so, the number of "0" bits in the good mark is not larger than M1 (because the good mark region 203 was failed to be programmed, although it should be programmed); the number of "0" bits in the bad mark is not larger than M2 (because the bad mark region 204 is not programmed yet); the enable bit in region A and in region B is set; the region A and the region B are the same (because the redundancy information regions 201 and 202 were already programmed to the expected pattern); the error bits in the region A and in region B is recovered by ECC (if the error bits is not too many). So the flow would be: 404->407->408->409->410->411->412->(if ECC check result is OK at step 412) 413->414. So, with the CHECK command, the good mark is programmed and this redundancy information set I could be effective again.

Possibility four: The redundancy information set 200 was not completely finished programming while doing on-the-fly repair during the last time erase operation. This could be caused by a RESET or ABORT command issued by user or an accidental powering off before the on-the-fly repair operation is done. Further, the region A 201 and the region B 202 were not correctly programmed neither. If so, the number of "0" bits in the good mark is not larger than M1; the number of "0" bits in the bad mark is not larger than M2 (because the bad mark region 204 should be programmed but was programmed yet); the enable bit in region A and in region B is set; the region A and the region B are not the same (because the redundancy information regions 201 and 202 were not correctly programmed to the expected pattern). So a bad mark should be given. The flow would be: 404->407->408->409->410->411->416.

Further, the flow in FIG. 3 and FIG. 4 are performed by for example, a FSM (finite state machine, not shown) of the memory 100.

To certain degree, the embodiment of the invention could also be adopted for other kind of nonvolatile memory devices. For example, NOR flash memory could be possible to use this kind of function. For any kind of nonvolatile memory, the chip itself installed in a system board could do repair automatically while it is operating, this all has to do with on-the-fly repair.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A method for repairing for a memory, comprising:
    finding whether there is any available and healthy redundancy block in the memory if a block erase operation is not passed;
    programming an address of a failed block to be repaired, an enable bit and at least one error correction bit into both first and second redundancy information regions in a redundancy information set of the memory;
    checking whether error in the first and the second redundancy information regions is recoverable based on the error correction bit; and
    if the error is recoverable, then programming the redundancy information set as effective to replace the failed block by the redundancy block related to the effective redundancy information set.

2. The method according to claim 1, wherein:
    if there is no available and healthy redundancy block in the memory, then the block erase operation is failed.

3. The method according to claim 1, further comprising:
    after programming, verifying the programmed first and the programmed second redundancy information regions.

4. The method according to claim 1, wherein the error correction bit is obtained based on the address of the failed block to be repaired and the enable bit.

5. The method according to claim 1, further comprising:
    if the error is not recoverable by the error correction bit, then programming the redundancy information set as problematic.

6. A method for repairing for a memory, comprising:
    reading a redundancy information set of the memory and checking whether the redundancy information set is effective based on the redundancy information set;
    if the redundancy information set is effective, reading the redundancy information set and repairing a failed block of the memory by a redundancy block related to the effective redundancy information set;
    if the redundancy information set is not effective, reading the redundancy information set and checking whether the redundancy information set is problematic based on the redundancy information set; and
    if the redundancy information set is neither effective nor problematic, reading the redundancy information set to determine to program the redundancy information set as effective or problematic based on the redundancy information set.

7. The method according to claim 6, wherein the step of checking whether the redundancy information set is effective based on the redundancy information set includes:
    checking whether a good mark pattern of the redundancy information set has programmed bits larger than a first criteria; and
    if the good mark pattern of the redundancy information set has programmed bits larger than the first criteria, then determining the redundancy information set as effective.

8. The method according to claim 7, wherein the step of checking whether the redundancy information set is problematic based on the redundancy information set includes:
    checking whether a bad mark pattern of the redundancy information set has programmed bits larger than a second criteria; and
    if the bad mark pattern of the redundancy information set has programmed bits larger than the second criteria, then determining the redundancy information set as problematic and skipping the problematic redundancy information set.

9. The method according to claim 8, further comprising:
    if the good mark pattern of the redundancy information set has programmed bits not larger than the first criteria, the bad mark pattern of the redundancy information set has programmed bits not larger than the second criteria and the redundancy information set is not enabled, determining the redundancy information set as unused.

10. The method according to claim 8, wherein the step of reading the redundancy information set to determine to program the redundancy information set as effective or problematic based on the redundancy information set includes:
    checking whether the redundancy information set is enabled;
    if the redundancy information set is enabled, comparing whether two redundancy information in the redundancy information set are the same;
    if the two redundancy information in the redundancy information set are the same and error thereof are recoverable, programming the good mark pattern the redundancy information set as effective, reading the redundancy information set and repairing the failed block of the memory by the redundancy block related to the effective redundancy information set.

11. The method according to claim 10, wherein the step of reading the redundancy information set to determine to program the redundancy information set as effective or problematic based on the redundancy information set includes:
    checking whether the redundancy information set is enabled;
    if the redundancy information set is enabled, comparing whether two redundancy information in the redundancy information set are the same; and
    if the two redundancy information in the redundancy information set are not the same, programming the bad mark pattern of the redundancy information set as problematic.

12. The method according to claim 10, wherein the step of reading the redundancy information set to determine to program the redundancy information set as effective or problematic based on the redundancy information set includes:
    checking whether the redundancy information set is enabled;
    if the redundancy information set is enabled, comparing whether two redundancy information in the redundancy information set are the same; and
    if the two redundancy information in the redundancy information set are the same but error thereof is not recoverable, programming the bad mark pattern of the redundancy information set as problematic.

13. The method according to claim 6, wherein the method is performed after an abort or reset command is issued while a block erase operation is still running.

14. The method according to claim 6, wherein the method is performed after accidentally power off.

15. The method according to claim 6, wherein the method is performed after powering on.

* * * * *